(12) United States Patent
Kapoor

(10) Patent No.: US 9,798,667 B2
(45) Date of Patent: Oct. 24, 2017

(54) STREAMING STRESS TESTING OF CACHE MEMORY

(71) Applicant: International Business Machines Corporation, Armonk, NY (US)

(72) Inventor: Shakti Kapoor, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 38 days.

(21) Appl. No.: 15/063,639

(22) Filed: Mar. 8, 2016

(65) Prior Publication Data

US 2017/0263332 A1    Sep. 14, 2017

(51) Int. Cl.
| | |
|---|---|
| G06F 12/08 | (2016.01) |
| G06F 12/0862 | (2016.01) |
| G11C 29/10 | (2006.01) |
| G06F 12/0811 | (2016.01) |
| G06F 12/0842 | (2016.01) |
| G06F 12/0897 | (2016.01) |
| G11C 29/04 | (2006.01) |

(52) U.S. Cl.
CPC ...... *G06F 12/0862* (2013.01); *G06F 12/0811* (2013.01); *G06F 12/0842* (2013.01); *G06F 12/0897* (2013.01); *G11C 29/10* (2013.01); *G06F 2212/1008* (2013.01); *G06F 2212/602* (2013.01); *G11C 2029/0401* (2013.01)

(58) Field of Classification Search
CPC ...... G06F 12/0862; G06F 12/16; G06F 11/30; G06F 2212/6026; G06F 12/08111; G06F 12/0842
See application file for complete search history.

(56) References Cited

U.S. PATENT DOCUMENTS

| | | | | |
|---|---|---|---|---|
| 6,212,603 B1 * | 4/2001 | McInerney | ........... | G06F 9/3802 711/125 |
| 6,327,559 B1 | 12/2001 | Wile | | |
| 6,546,507 B1 | 4/2003 | Coyle et al. | | |
| 7,177,985 B1 * | 2/2007 | Diefendorff | ........ | G06F 12/0862 711/118 |
| 8,103,832 B2 * | 1/2012 | Gara | .................... | G06F 12/0862 711/118 |
| 8,250,440 B2 | 8/2012 | Busaba et al. | | |

(Continued)

OTHER PUBLICATIONS

Sohoni et al., Improving L2 Cache performance through stream directed optimizations, 2004, CiteSeer, (retrieved from google.com Jun. 8, 2017) pp. 1 to 34.*

*Primary Examiner* — Shelly A Chase
(74) *Attorney, Agent, or Firm* — Cantor Colburn LLP

(57) ABSTRACT

An aspect includes a method of streaming stress testing in a cache memory system. The method includes configuring, by a streaming stress generator, one or more streams of cache lines in the cache memory system to be accessed by a cache prefetch engine of a processor. One or more stream parameters are randomized to vary a streaming stress applied by the one or more streams to the cache memory system. The one or more streams are generated as read or write requests to the cache lines as prefetches from the cache prefetch engine absent a request for the cache lines from a processor core of the processor. A determination is made as to whether any faults are detected while the one or more streams are prefetched.

20 Claims, 6 Drawing Sheets

(56) References Cited

U.S. PATENT DOCUMENTS

| | | | |
|---|---|---|---|
| 8,347,039 B2 * | 1/2013 | Boyle | G06F 12/0862 711/137 |
| 8,904,236 B2 | 12/2014 | Ben-Yehuda et al. | |
| 2010/0070648 A1 | 3/2010 | Zhu et al. | |
| 2013/0346756 A1 | 12/2013 | Cook et al. | |
| 2014/0257739 A1 | 9/2014 | Dagan et al. | |
| 2014/0310478 A1 | 10/2014 | Dodson et al. | |

* cited by examiner

STREAMING STRESS TESTING OF CACHE MEMORY

BACKGROUND

The present invention relates to computer memory systems, and more specifically, to streaming stress testing of cache memory of a processor in a computer system.

In some computer systems, cache memory can increase instruction and data processing throughput, but cache memory can be difficult to test. Validation and verification processes performed during cache memory system development can apply traffic to cache memory to confirm that the cache memory is operating as expected. Cache memory may be stress tested by making demands on cache lines using a dedicated thread of a multi-threaded processor to access a shared cache. However, the ability to fully stress the cache memory is limited with this approach. Further, depending on the processor workload, there may not be threads available for implementing stress tests, which can slow testing progress and increase total testing time.

SUMMARY

According to one embodiment, a method of streaming stress testing in a cache memory system is provided. The method includes configuring, by a streaming stress generator, one or more streams of cache lines in the cache memory system to be accessed by a cache prefetch engine of a processor. One or more stream parameters are randomized to vary a streaming stress applied by the one or more streams to the cache memory system. The one or more streams are generated as read or write requests to the cache lines as prefetches from the cache prefetch engine absent a request for the cache lines from a processor core of the processor. A determination is made as to whether any faults are detected while the one or more streams are prefetched.

According to another embodiment, a cache memory system in a processor includes a plurality of cache memories, a cache prefetch engine, and a streaming stress generator. The streaming stress generator configures one or more streams of cache lines in the cache memory system to be accessed by the cache prefetch engine. One or more stream parameters are randomized to vary a streaming stress applied by the one or more streams to the cache memory system. The one or more streams are generated as read or write requests to the cache lines as prefetches from the cache prefetch engine absent a request for the cache lines from a processor core of the processor. A determination is made as to whether any faults are detected while the one or more streams are prefetched.

According to yet another embodiment, a computer program product for streaming stress testing in a cache memory system is provided. The computer program product includes a computer readable storage medium having program instructions embodied therewith. The program instructions are executable by processing circuitry to cause the processing circuitry to configure, by a streaming stress generator, one or more streams of cache lines in the cache memory system to be accessed by a cache prefetch engine of a processor. One or more stream parameters are randomized to vary a streaming stress applied by the one or more streams to the cache memory system. The one or more streams are generated as read or write requests to the cache lines as prefetches from the cache prefetch engine absent a request for the cache lines from a processor core of the processor. A determination is made as to whether any faults are detected while the one or more streams are prefetched.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments described herein are directed to streaming stress testing in a cache memory system in a computer system. Embodiments assist in validating and verifying performance of the cache memory as part of a stress testing process. A cache prefetch engine can be configured by a streaming stress generator to generate streams of read and/or write requests of cache lines with varying parameters to access a cache memory system. Multiple streams can be active in parallel to stress test the cache memory system. Streaming stress tests can be applied to level-two (L2) cache and/or level-three (L3) cache for a plurality of processor cores. Streaming stress testing can be enabled, for example, as part of a built-in self-test process to verify capabilities of the cache memory (e.g., as part of a startup test process). Any number of streams can be supported in parallel depending on the processing system architecture. For example, up to sixteen streams per processor core can be active in parallel during stress testing.

Figure 1:
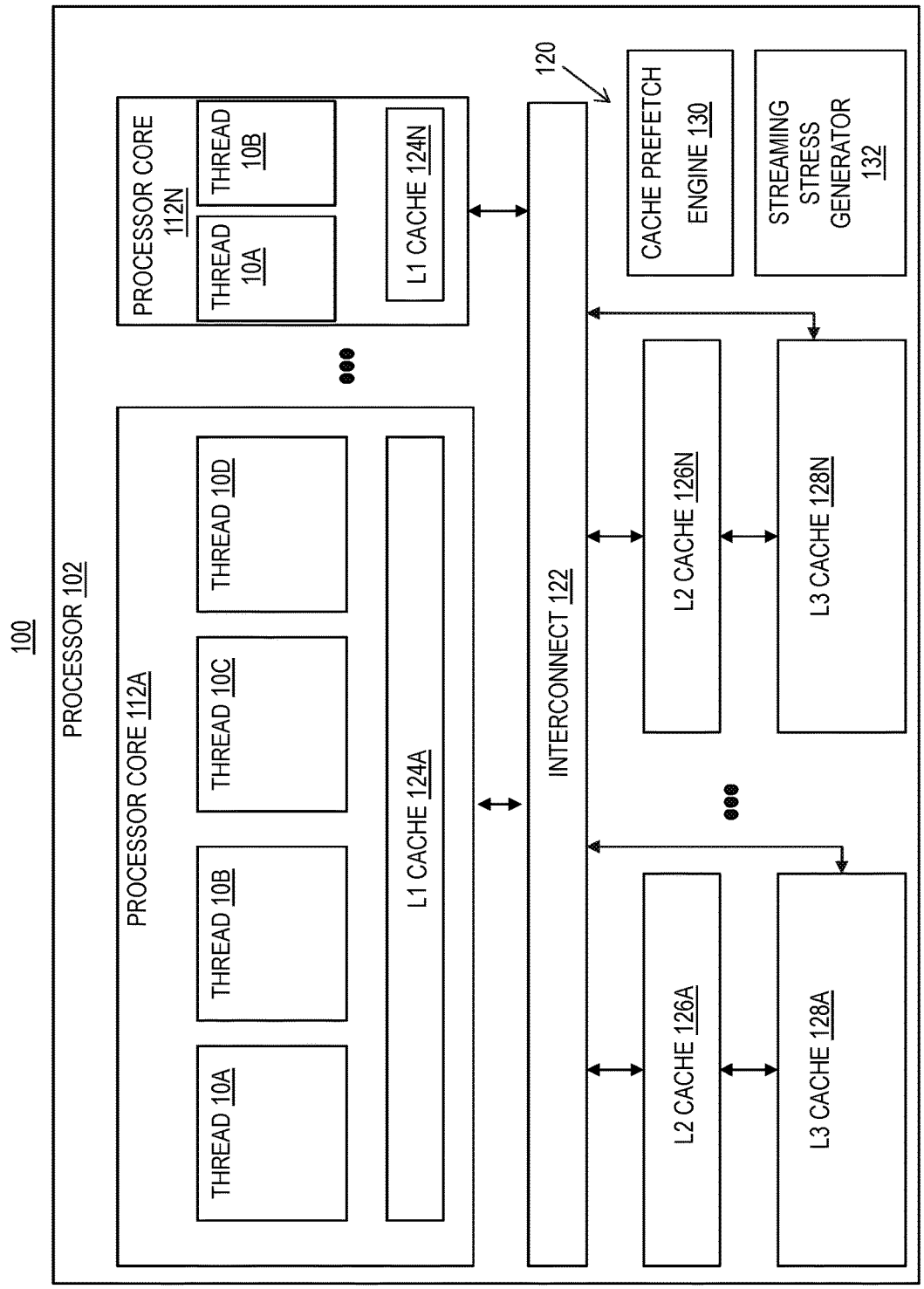
FIG. 1 is a block diagram of an exemplary processing system according to embodiments.

FIG. 1 illustrates a block diagram of a processing system 100 that can include one or more instances of a processor 102. FIG. 1 depicts a plurality of processor cores 112A through 112N (generally referred to as processor cores 112 on one processor die or processor 102, connected with an interconnect 122, under management of an interconnect control (not shown). Each processor core 112A-N may have an instruction cache for caching instructions from memory to be executed and a data cache for caching data (operands) of memory locations to be operated on by the processor core 112, which are depicted generally as L1 cache 124A-N. It is understood that the processor cores 112A-N are physical devices that include all the circuitry (i.e., hardware along with firmware) necessary to execute instructions as understood by one skilled in the art. Although the processor 102 may include multiple processor cores 112A-N, various examples may be provided with reference to processor core 112A and processor core 112N for ease of understanding and not limitation. Thus, the processor 102 includes any combination of one or more processor cores 112. It is understood that further details shown and discussed relative to processor core 112A apply by analogy to all processor cores 112, and these details may be included in all of the processor cores 112.

The processor core 112A is shown with four threads 10A, 10B, 10C, and 10D (generally referred to as thread or threads 10), and each thread 10A-10D includes a separate sequence of instructions or instruction streams, such as a program or portion thereof. Each processor core 112A-112N may be configured to support different levels of simultaneous multi-threaded (SMT) operation, i.e., a different number of threads 10. In the example of FIG. 1, processor core 112A is in SMT-4 mode, meaning that four threads 10A-10D are configured to execute in parallel, while processor core 112N is in SMT-2 mode with threads 10A and 10B. A processor core 112 may be configured in a single thread mode or a higher order mode with a higher number of threads depending upon implementation.

At an architecture level, each thread 10 may represent an independent central processing unit (CPU). Instructions which the thread 10 has for execution by the processor core 112 can include a number of instruction classes, such as: general, decimal, floating-point-support (FPS), binary-floating-point (BFP), decimal-floating-point (DFP), hexadecimal-floating-point (HFP), control, and I/O instructions. The general instructions can be used in performing binary-integer arithmetic operations and logical, branching, and other non-arithmetic operations. The decimal instructions operate on data in decimal format. The BFP, DFP, and HFP instructions operate on data in BFP, DFP, and HFP formats, respectively, while the FPS instructions operate on floating-point data independent of the format or convert from one format to another. To achieve higher throughput, various resource units of each processor core 112 are accessed in parallel by executing one or more of the instructions in a thread 10 using a processing pipeline.

Regardless of the number of threads 10 configured in each of the processor cores 112A-N, cache memory resources can be managed on a processor core basis. For instance, a cache memory system 120 of the processor 102 includes L1 cache 124A-N, L2 cache 126A-N, and L3 cache 128A-N. L1 cache 124A, L2 cache 126A, and L3 cache 128A form a cache hierarchy for processor core 112A. Similarly, L1 cache 124N, L2 cache 126N, and L3 cache 128N form a cache hierarchy for processor core 112N. Cache prefetch engine 130 can prefetch cache lines within the cache memory system 120 prior to receiving a request by the processor cores 112A-N. For example, under normal operation, the cache prefetch engine 130 can monitor cache accesses to L2 cache 126A and/or L3 cache 128A by processor core 112A to learn access patterns as streams associated with processor core 112A, where each stream may be associated with a thread 10 of processor core 112A. Access patterns can include repeated accesses to particular cache lines, a sequence of cache lines, and/or a number of cache elements accessed in a sequence. In order to test the ability of the cache memory system 120 to tolerate and correctly handle a wide variety and volume of stream accesses of the cache memory system 120, a streaming stress generator 132 can configure a number of parameters to generate streams of read and/or write requests using the cache prefetch engine 130 as further described herein. The cache prefetch engine 130 and the streaming stress generator 132 may be implemented in processing circuitry within the processor 102 such that none of the threads 10 needs to be dedicated to performing streaming stress testing.

Figure 2A:
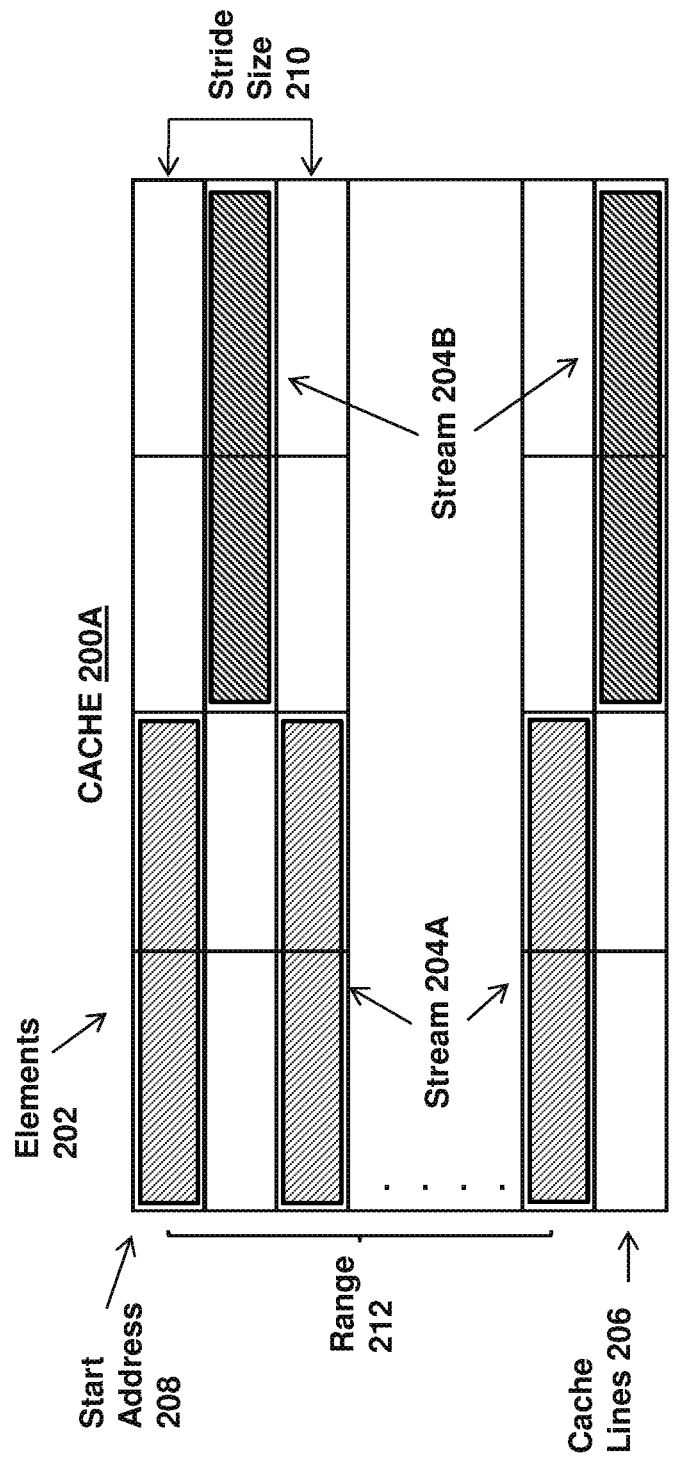
FIGS. 2A and 2B are cache memory configuration examples according to embodiments.

FIG. 2A is a block diagram of a cache memory state 200A as an example of cache memory within the processor 102 of FIG. 1, such as L2 cache 126A or L3 cache 128A. Cache memory state 200A in the example of FIG. 2A includes a plurality of elements 202 that can span a plurality of cache lines 206. Streams 204 of cache lines 206 can be associated with a particular thread 10 of FIG. 1 or may be arbitrarily generated for testing purposes. A stream 204A may be defined by a starting address 208 and a stride size 210 across a range 212. Stream 204A can be interleaved with other streams, such as stream 204B. Streams 204 can vary in a number of parameters. For example, the streaming stress generator 132 of FIG. 1 can configure one or more of: a start address of each stream 204, a size of each stream 204, an element size (e.g., bytes per element) accessed in each stream 204, an address stride between accesses of each stream 204, and a frequency of access of each stream 204. The streaming stress generator 132 of FIG. 1 can also configure one or more of: a read data pattern, a write data pattern, data to be written, and expected data to be read. Thus, testing can populate the cache memory system 120 with various read/write data patterns, and the fault detection can verify that the expected read/write operations were successful.

Various stream parameters can be randomized by the streaming stress generator 132 of FIG. 1 to vary the testing load on the cache memory system 120 of FIG. 1. For example, one or more stream parameters can be randomized such as one or more of: a number of test iterations per stream 204, stride size 210, a transient cache line type, and an urgency of prefetch. The number of test iterations per stream 204 can be set to run continuous testing or be randomized within a range. Randomization of the stride size 210 can test different spans between elements 202 of a stream 204. The transient cache line type may change how rapidly cache lines 206 are reassigned to different streams 204. An urgency of prefetch can change how much delay occurs between updates to contents of a stream 204 and performing a prefetch of the stream 204.

Figure 2B:
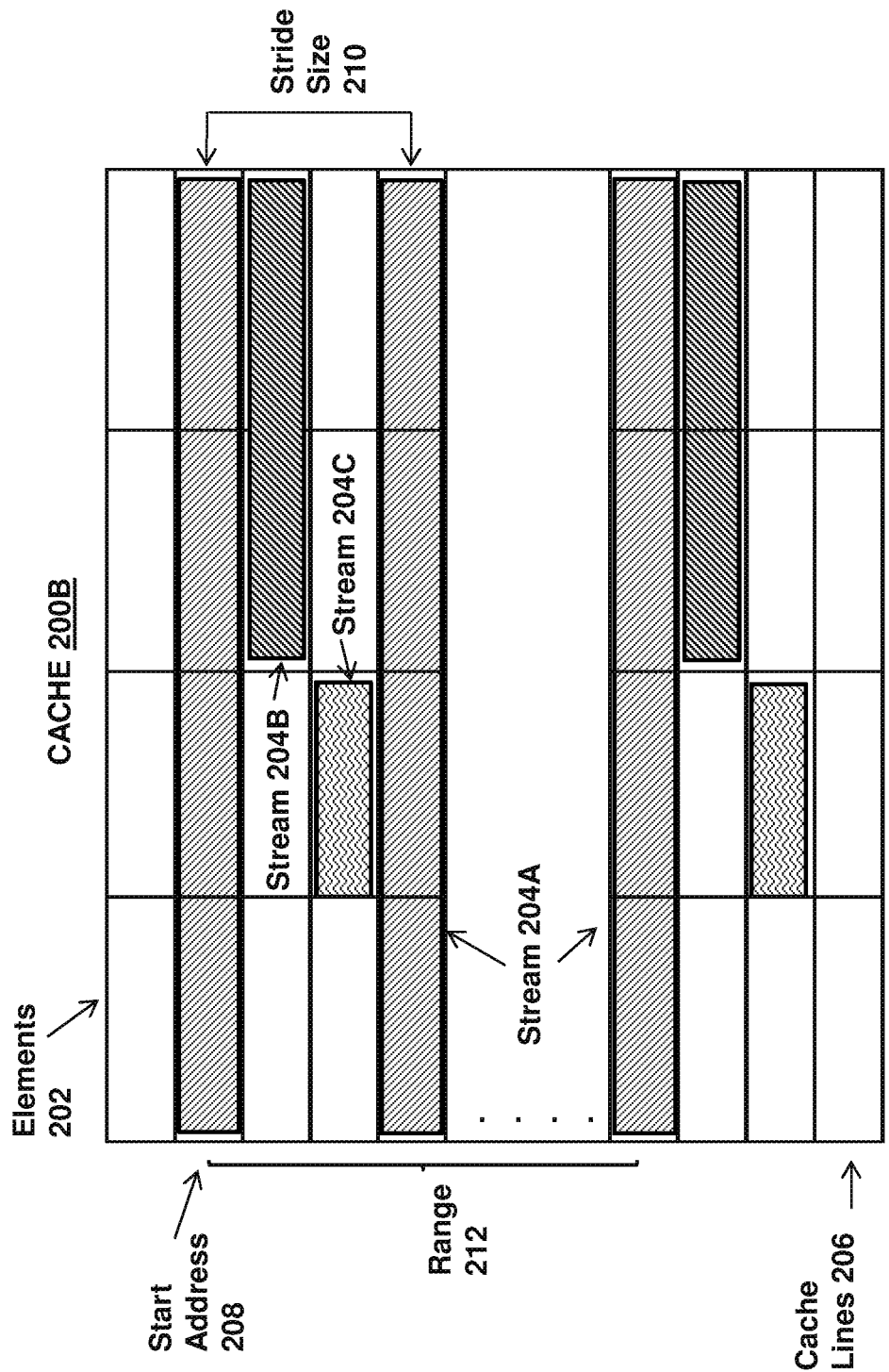

FIG. 2B depicts a modified cache memory state 200B where element 202 sizes vary between streams 204A, 204B, and 204C. Stream 204C has been added between elements of 202 of stream 204A, where the stride size 210 of stream 204A is extended with respect to FIG. 2A. The start address 208 may also be shifted to a different location for stream 204A in the modified cache memory state 200B. The range 212 may also change.

Figure 3:
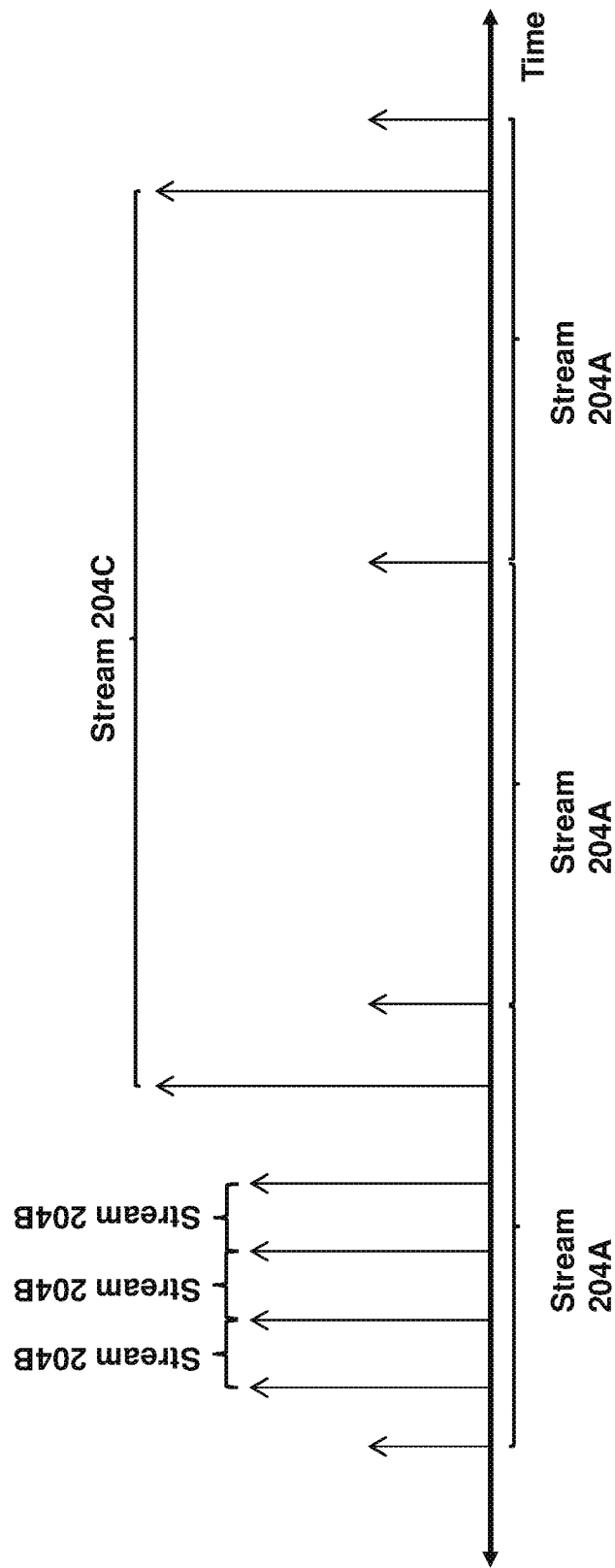
FIG. 3 is a timing diagram of various streams according to an embodiment.

FIG. 3 is an example of a timing diagram of various streams 204 according to another embodiment. In the example of FIG. 3, multiple elements of stream 204B are prefetched between elements of stream 204A. Stream 204C may be modified to include larger elements that are accessed much less frequently than elements of stream 204A or 204B. In the example of FIG. 3, stream 204B may have a higher frequency than streams 204A and 204C and a greater urgency than stream 204C. The relative height of the lines in FIG. 3 may indicate relative element sizes per access for streams 204A-C. By randomizing one or more stream parameters, the streaming stress generator 132 of FIG. 1 can vary a streaming stress applied by the one or more streams 204 to the cache memory system 120 of FIG. 1. While several variations are depicted in FIGS. 2A, 2B, and 3, it will be understood that the streaming stress generator 132 of FIG. 1 can randomize multiple parameters concurrently to test a wide range of stream configurations in the cache memory system 120 of FIG. 1. Further, any number of streams 204 (1 to N) may be utilized in stream stress testing depending upon architectural constraints of the processor 102 of FIG. 1.

Figure 4:
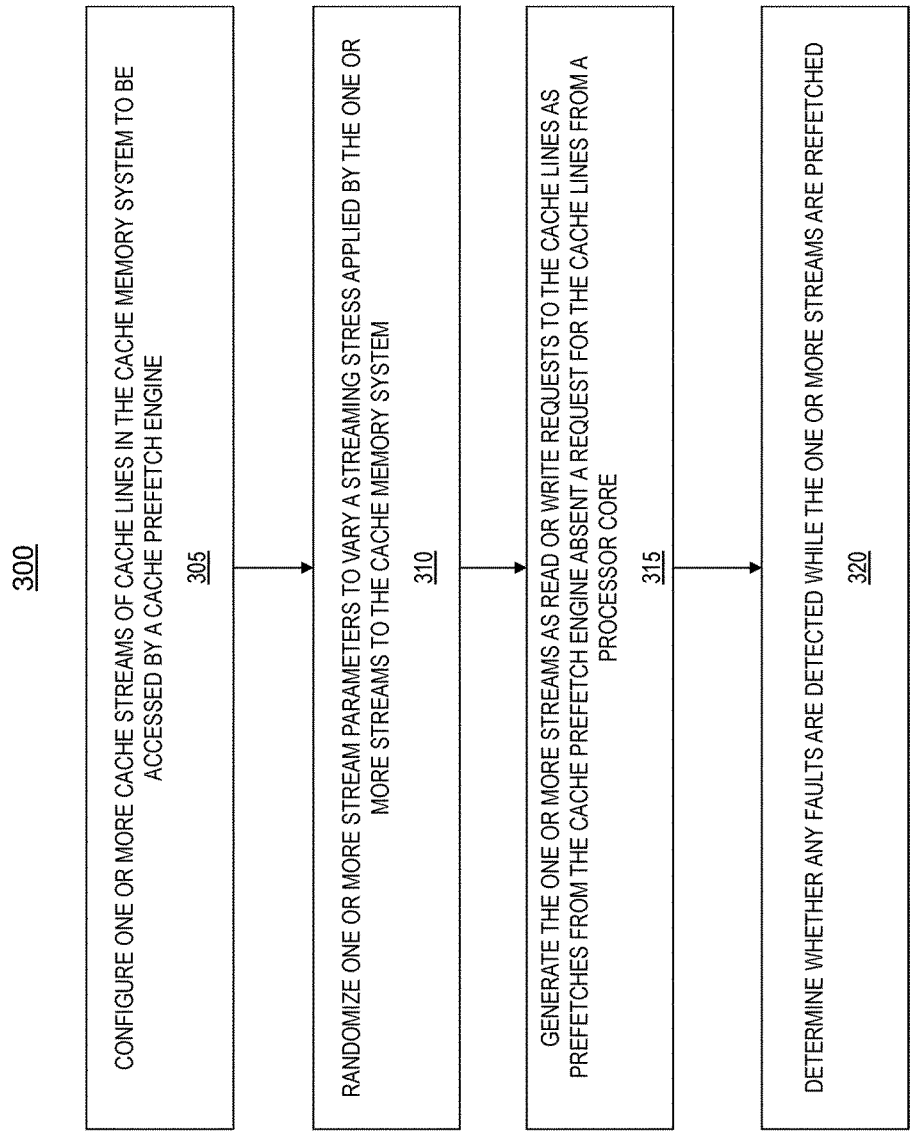
FIG. 4 is a process flow according to an embodiment.

FIG. 4 is a process flow of a method 300 according to an embodiment. The method 300 can be performed by various elements of the system 100 of FIG. 1, such as the streaming stress generator 132 within processor 102 of FIG. 1, and is described in reference to FIGS. 1-4. Although a particular order of blocks is depicted and described with respect to FIG. 4, it will be understood that the order can be changed, and the blocks may be combined or further subdivided. For purposes of explanation, the method 300 is described with respect to the processor 102 of FIG. 1. The streaming stress testing can be performed, for example, on level-two and/or level-three cache within the processor 102.

At block 305, the streaming stress generator 132 can configure one or more streams 204 of cache lines 206 in the cache memory system 120 to be accessed by a cache prefetch engine 130 of a processor 102. The streaming stress generator 132 can configure one or more of: a start address of each stream 204, a size of each stream 204, an element size accessed in each stream 204, an address stride (e.g., stride size 210) between accesses of each stream 204, and a frequency of access of each stream 204. The streaming stress generator 132 can further configure one or more of: a read data pattern, a write data pattern, data to be written, and expected data to be read. The processor 102 can be a multi-core processor, where the streaming stress testing is performed in parallel for a plurality of processor cores 112A-N in the processor 102. The cache prefetch engine 130 can monitor access patterns of the processor cores 112A-N to the cache memory system 120 to identify the one or more streams 204 and a stride size 210 of each stream 204.

At block 310, the streaming stress generator 132 can randomize one or more stream parameters to vary a streaming stress applied by the one or more streams 204 to the cache memory system 120. The one or more stream parameters to be randomized can include one or more of: a number of test iterations per stream 204, a stride size 210, a transient cache line type, and an urgency of prefetch.

At block 315, the streaming stress generator 132 can generate the one or more streams 204 as read or write requests to the cache lines 206 as prefetches from the cache prefetch engine 130 absent a request for the cache lines 206 from a processor core 112 of the processor 102.

At block 320, the streaming stress generator 132 can determine whether any faults are detected while the one or more streams 204 are prefetched. Faults can be manifested as data errors, arbitration errors, bus errors, address generation errors, and the like.

Figure 5:
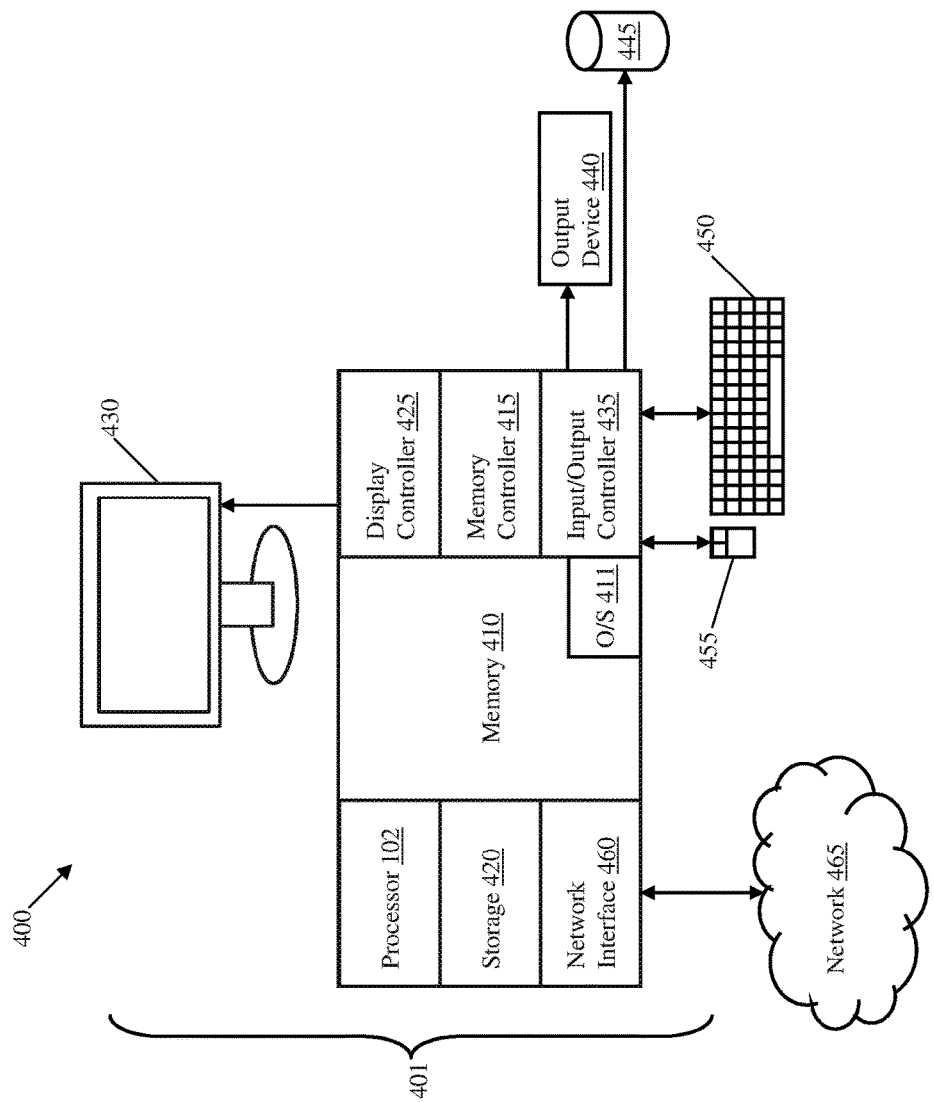
FIG. 5 is block diagram of a processing system according to an embodiment.

FIG. 5 depicts a block diagram of a system 400 for streaming stress testing of cache memory in processor 102 of FIG. 1. The methods described herein can be implemented in hardware, software (e.g., firmware), or a combination thereof. In an exemplary embodiment, the methods described herein are implemented in hardware as part of the microprocessor of a computer, such as a personal computer, workstation, minicomputer, or mainframe computer. The system 400 therefore includes computer 401 as illustrated in FIG. 5.

In an exemplary embodiment, in terms of hardware architecture, as shown in FIG. 5, the computer 401 includes processor 102 of FIG. 1 that is operable to perform lateral cast out of cache memory. The computer 401 further includes memory 410 (e.g., main memory) coupled to a memory controller 415, and one or more input and/or output (I/O) devices 440, 445 (or peripherals) that are communicatively coupled via a local input/output controller 435. The input/output controller 435 can be, for example but not limited to, one or more buses or other wired or wireless connections, as is known in the art. The input/output controller 435 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 102 is a hardware device for executing software, particularly that stored in storage 420, such as cache storage, or memory 410. The processor 102 can be any custom made or commercially available processor, a central processing unit (CPU), an auxiliary processor among several processors associated with the computer 401, a semiconductor based microprocessor (in the form of a microchip or chip set), a macroprocessor, or generally any device for executing instructions.

The memory 410 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 410 may incorporate electronic, magnetic, optical, and/or other types of storage media. Note that the memory 410 can have a distributed architecture, where various components are situated remote from one another, but can be accessed by the processor 102.

The instructions in memory 410 may include one or more separate programs, each of which comprises an ordered listing of executable instructions for implementing logical functions. In the example of FIG. 5, the instructions in the memory 410 can include a suitable operating system (OS) 411. The operating system 411 essentially controls the execution of other computer programs and provides scheduling, input-output control, file and data management, memory management, and communication control and related services.

In an exemplary embodiment, a conventional keyboard 450 and mouse 455 can be coupled to the input/output controller 435. Other output devices such as the I/O devices 440, 445 may include input devices, for example but not limited to a printer, a scanner, microphone, and the like. Finally, the I/O devices 440, 445 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 400 can further include a display controller 425 coupled to a display 430. In an exemplary embodiment, the system 400 can further include a network interface 460 for coupling to a network 465. The network 465 can be an IP-based network for communication between the computer 401 and any external server, client and the like via a broadband connection. The network 465 transmits and receives data between the computer 401 and external systems. In an exemplary embodiment, network 465 can be a managed IP network administered by a service provider. The network 465 may be implemented in a wireless fashion, e.g., using wireless protocols and technologies, such as WiFi, WiMax, etc. The network 465 can also be a packet-switched network such as a local area network, wide area network, metropolitan area network, Internet network, or other similar type of network environment. The network 465 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 401 is a PC, workstation, intelligent device or the like, the instructions in the memory 410 may further include a basic input output system (BIOS) (omitted for simplicity). The BIOS is a set of essential software routines that initialize and test hardware at startup, start the OS 411, and support the transfer of data among the hardware devices. The BIOS is stored in ROM so that the BIOS can be executed when the computer 401 is activated. BIOS or other instructions in memory 410 or storage 420 may trigger and manage execution of a stress test mode as part of a built-in self-test process.

When the computer 401 is in operation, the processor 102 is configured to fetch and execute instructions stored within the memory 410, to communicate data to and from the memory 410, and to generally control operations of the computer 401 pursuant to the instructions.

In an exemplary embodiment, where the cache prefetch engine 130 and/or the streaming stress generator 132 of FIG. 1 is implemented in hardware, the methods described herein, such as method 300 of FIG. 4, can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Technical effects and benefits include built-in self-test capability within a processing system to perform streaming stress testing of a cache memory system.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of streaming stress testing in a cache memory system, the method comprising:
    configuring, by a streaming stress generator, one or more streams of cache lines in the cache memory system to be accessed by a cache prefetch engine of a processor;
    randomizing one or more stream parameters to vary a streaming stress applied by the one or more streams to the cache memory system;
    generating the one or more streams as read or write requests to the cache lines as prefetches from the cache prefetch engine absent a request for the cache lines from a processor core of the processor; and
    determining whether any faults are detected while the one or more streams are prefetched.

2. The method according to claim 1, wherein the streaming stress generator configures one or more of: a start address of each stream, a size of each stream, an element size accessed in each stream, an address stride between accesses of each stream, and a frequency of access of each stream.

3. The method according to claim 2, wherein the streaming stress generator further configures one or more of: a read data pattern, a write data pattern, data to be written, and expected data to be read.

4. The method according to claim 1, wherein the one or more stream parameters to be randomized comprise one or more of: a number of test iterations per stream, a stride size, a transient cache line type, and an urgency of prefetch.

5. The method according to claim 1, wherein the processor is a multi-core processor and streaming stress testing is performed in parallel for a plurality of processor cores in the processor.

6. The method according to claim 5, wherein the cache prefetch engine monitors access patterns of the processor cores to the cache memory system to identify the one or more streams and a stride size of each stream.

7. The method according to claim 1, wherein the streaming stress testing is performed on level-two and level-three cache within the processor.

8. A cache memory system in a processor, the cache memory system comprising:
    a plurality of cache memories;
    a cache prefetch engine; and
    a streaming stress generator configured to perform:
        configuring one or more streams of cache lines in the cache memory system to be accessed by the cache prefetch engine;
        randomizing one or more stream parameters to vary a streaming stress applied by the one or more streams to the cache memory system;
        generating the one or more streams as read or write requests to the cache lines as prefetches from the cache prefetch engine absent a request for the cache lines from a processor core of the processor; and
        determining whether any faults are detected while the one or more streams are prefetched.

9. The cache memory system according to claim 8, wherein the streaming stress generator configures one or more of: a start address of each stream, a size of each stream, an element size accessed in each stream, an address stride between accesses of each stream, and a frequency of access of each stream.

10. The cache memory system according to claim 9, wherein the streaming stress generator further configures one or more of: a read data pattern, a write data pattern, data to be written, and expected data to be read.

11. The cache memory system according to claim 8, wherein the one or more stream parameters to be randomized comprise one or more of: a number of test iterations per stream, a stride size, a transient cache line type, and an urgency of prefetch.

12. The cache memory system according to claim 8, wherein the processor is a multi-core processor, streaming stress testing is performed in parallel for a plurality of processor cores in the processor, and the cache prefetch engine monitors access patterns of the processor cores to the cache memory system to identify the one or more streams and a stride size of each stream.

13. The cache memory system according to claim 8, wherein the streaming stress testing is performed on level-two and level-three cache within the processor.

14. A computer program product for streaming stress testing in a cache memory system, the computer program product comprising a computer readable storage medium having program instructions embodied therewith, the program instructions executable by processing circuitry to cause the processing circuitry to:
configure, by a streaming stress generator, one or more streams of cache lines in the cache memory system to be accessed by a cache prefetch engine of a processor;
randomize one or more stream parameters to vary a streaming stress applied by the one or more streams to the cache memory system;
generate the one or more streams as read or write requests to the cache lines as prefetches from the cache prefetch engine absent a request for the cache lines from a processor core of the processor; and
determine whether any faults are detected while the one or more streams are prefetched.

15. The computer program product according to claim 14, wherein the streaming stress generator configures one or more of: a start address of each stream, a size of each stream, an element size accessed in each stream, an address stride between accesses of each stream, and a frequency of access of each stream.

16. The computer program product according to claim 15, wherein the streaming stress generator further configures one or more of: a read data pattern, a write data pattern, data to be written, and expected data to be read.

17. The computer program product according to claim 14, wherein the one or more stream parameters to be randomized comprise one or more of: a number of test iterations per stream, a stride size, a transient cache line type, and an urgency of prefetch.

18. The computer program product according to claim 14, wherein the processor is a multi-core processor and streaming stress testing is performed in parallel for a plurality of processor cores in the processor.

19. The computer program product according to claim 18, wherein the cache prefetch engine monitors access patterns of the processor cores to the cache memory system to identify the one or more streams and a stride size of each stream.

20. The computer program product according to claim 14, wherein the streaming stress testing is performed on level-two and level-three cache within the processor.

* * * * *